United States Patent
Li et al.

(10) Patent No.: US 9,748,147 B1
(45) Date of Patent: Aug. 29, 2017

(54) METHOD OF FABRICATING EPITAXIAL LAYER

(71) Applicant: UNITED MICROELECTRONICS CORP., Hsin-Chu (TW)

(72) Inventors: Yi-Fan Li, Tainan (TW); Li-Wei Feng, Kaohsiung (TW); Li-Chieh Hsu, Taichung (TW); Chun-Jen Chen, Tainan (TW); I-Cheng Hu, Kaohsiung (TW); Tien-I Wu, Taoyuan (TW); Yu-Shu Lin, Pingtung County (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/214,467

(22) Filed: Jul. 20, 2016

(30) Foreign Application Priority Data

Jun. 21, 2016 (CN) .......................... 2016 1 0452293

(51) Int. Cl.
| | | |
|---|---|---|
| *H01L 21/20* | (2006.01) | |
| *H01L 21/8238* | (2006.01) | |
| *H01L 21/265* | (2006.01) | |
| *H01L 21/02* | (2006.01) | |
| *H01L 21/308* | (2006.01) | |

(52) U.S. Cl.
CPC .. *H01L 21/823821* (2013.01); *H01L 21/0243* (2013.01); *H01L 21/02521* (2013.01); *H01L 21/02529* (2013.01); *H01L 21/02532* (2013.01); *H01L 21/02587* (2013.01); *H01L 21/02634* (2013.01); *H01L 21/02636* (2013.01); *H01L 21/02661* (2013.01); *H01L 21/2652* (2013.01); *H01L 21/3086* (2013.01)

(58) Field of Classification Search
CPC ......... H01L 27/10826; H01L 27/10879; H01L 27/0924; H01L 27/1211; H01L 27/0886; H01L 29/41791; H01L 29/66795; H01L 29/785; H01L 2029/7858; H01L 2924/13067; H01L 21/823431; H01L 21/823821; H01L 21/845
See application file for complete search history.

(56) References Cited

U.S. PATENT DOCUMENTS

| | | | | |
|---|---|---|---|---|
| 2015/0054040 A1* | 2/2015 | Lee | ................. | H01L 21/823412 257/288 |
| 2015/0294902 A1* | 10/2015 | Carothers | ......... | H01L 21/76278 257/506 |
| 2016/0211254 A1* | 7/2016 | Kang | .................. | H01L 27/0266 |

* cited by examiner

*Primary Examiner* — Thanh T Nguyen
(74) *Attorney, Agent, or Firm* — Winston Hsu

(57) ABSTRACT

A method of fabricating an epitaxial layer includes providing a silicon substrate. A dielectric layer covers the silicon substrate. A recess is formed in the silicon substrate and the dielectric layer. A selective epitaxial growth process and a non-selective epitaxial growth process are performed in sequence to respectively form a first epitaxial layer and a second epitaxial layer. The first epitaxial layer does not cover the top surface of the dielectric layer. The recess is filled by the first epitaxial layer and the second epitaxial layer. Finally, the first epitaxial layer and the second epitaxial layer are planarized.

10 Claims, 5 Drawing Sheets

METHOD OF FABRICATING EPITAXIAL LAYER

BACKGROUND OF THE INVENTION

1. Field of the Invention

The present invention relates to a method of fabricating an epitaxial layer, and more particularly to a method of fabricating an epitaxial layer by combining a selective epitaxial growth process and a non-selective epitaxial growth process.

2. Description of the Prior Art

As integrated circuits become downscaled, the corresponding requirements also increase. Modern transistors need to have higher drive currents as their dimensions become ever smaller.

Such down scaling has also increased the complexity of processing and manufacturing ICs. For advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been adequate for their intended purposes, they have not been satisfactory in all respects. Therefore, there is a need for improvement in methods of fabricating FinFET devices.

SUMMARY OF THE INVENTION

According to a preferred embodiment of the present invention, a method of fabricating an epitaxial layer includes providing a silicon substrate comprising a dielectric layer disposed thereon. Then, a recess is formed in the silicon substrate and the dielectric layer. Later, a selective epitaxial growth process is performed to form a first epitaxial layer in the recess, wherein the first epitaxial layer does not cover a top surface of the dielectric layer. After that, a non-selective epitaxial growth process is performed to form a second epitaxial layer in the recess. The second epitaxial layer covers the top surface of the dielectric layer, wherein the recess is filled up by the first epitaxial layer and the second epitaxial layer. Finally, the second epitaxial layer is planarized to align the top surface of the second epitaxial layer with the top surface of the dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 depicts a method of fabricating an epitaxial layer, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7;
FIG. 9 is a fabricating stage following FIG. 8; and
FIG. 10 is a fabricating stage following FIG. 9.

DETAILED DESCRIPTION

Figure 1:
Figure 1:
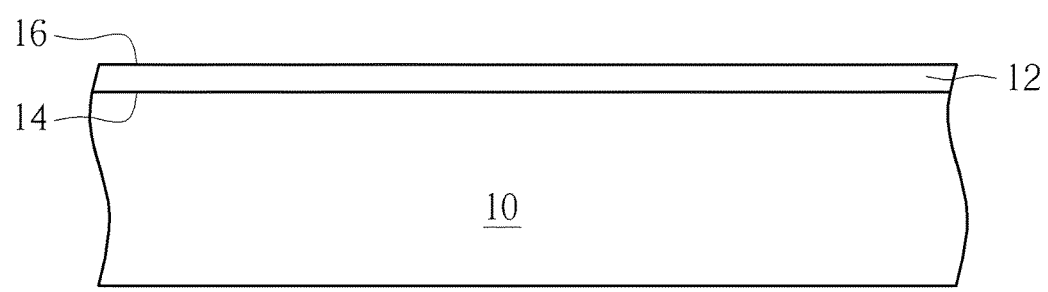

FIG. 1 to FIG. 10 depicts a method of fabricating an epitaxial layer according to a preferred embodiment of the present invention. As shown in FIG. 1, a silicon substrate 10 is provided. A dielectric layer 12 is formed on the silicon substrate 10. The dielectric layer may be a single layer or a multiple layer structure. The dielectric layer 12 may include silicon nitride, silicon oxide or silicon oxynitride. The dielectric layer 12 contacts a top surface 14 of the silicon substrate 10. A top surface 16 of the dielectric layer 12 is parallel to a top surface 14 of the silicon substrate 10. A first region A and a second region B can be defined on the silicon substrate 10 according to a preferred embodiment of the present invention. The first region A may be a peripheral region or a planar transistor region. The second region B may be a core circuit region or a FinFET region. The second region B can be further defined into two doping regions such as an N-type doping region and a P-type doping region. The dielectric layer 12 may also serve as a pad oxide for forming a shallow trench isolation in the first region A.

Figure 2:
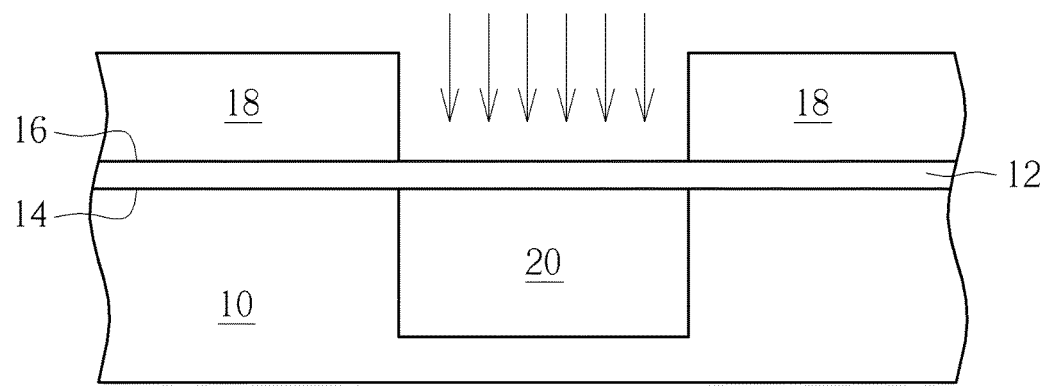
Figure 3:
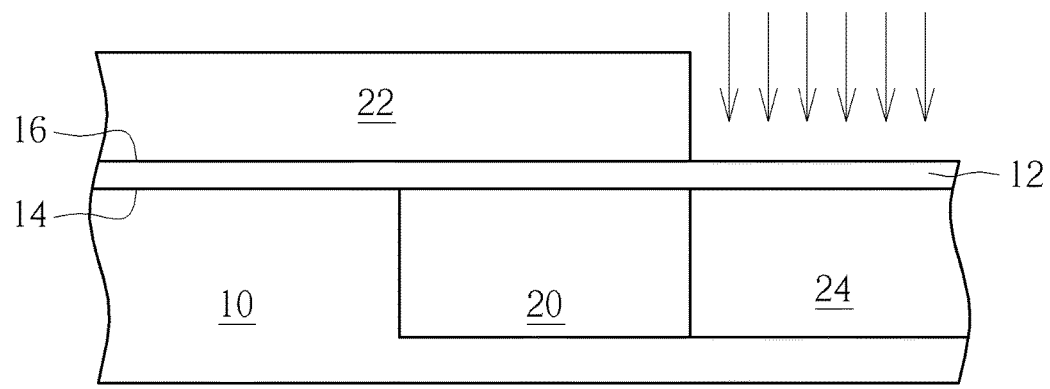

The formation steps of the N-type doping region and the P-type doping region are shown in FIG. 2 and FIG. 3. The fabricating sequences of the N-type doping region and the P-type doping region can be exchanged based on different product requirements.

As shown in FIG. 2, a patterned mask layer 18 such as a photoresist layer is formed to cover part of the silicon substrate 10 and the dielectric layer 12. Part of the silicon substrate 10 and part of the dielectric layer 12 are exposed through the patterned mask layer 18. Next, an ion implantation process is performed for implanting N-type dopants into the silicon substrate 10 to form an N-type doping region 20. After that, the patterned mask layer 18 is removed. As shown in FIG. 3, another patterned mask layer 22 such as a photoresist layer is formed to cover part of the silicon substrate 10 and the dielectric layer 12. A region of the silicon substrate 10 without the N-type doping region 20 is not covered by the patterned mask layer 22. Later, an ion implantation process is performed for implanting P-type dopants into the silicon substrate 10 to form a P-type doping region 24. Subsequently, the patterned mask layer 22 is removed. After that, a rapid thermal process is performed to drive in the N-type dopants and the P-type dopants.

Figure 4:
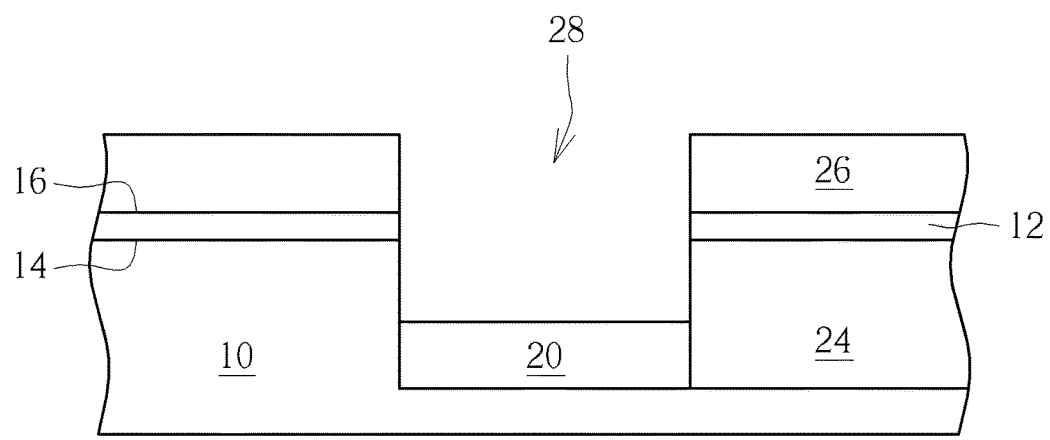

As shown in FIG. 4, a patterned mask layer 26 is formed to cover the silicon substrate 10. The dielectric layer 12 directly on the N-type doping region 20 is exposed through the patterned mask layer 26. Later, the dielectric layer 12 and the silicon substrate 10 are etched to form a recess 28 by taking the patterned mask layer 26 as a mask. The process of forming the recess 28 includes entirely etching the dielectric layer 12 directly on the N-type doping region 20 followed by etching part of the N-type doping region 20. The recess 28 will therefore be defined by the silicon substrate 10 and the dielectric layer. Subsequently, the patterned mask layer 26 is removed.

In the following processes, epitaxial layers will be formed in the recess 28. In order to form the epitaxial layers with better quality, a pre-clean process can be performed before forming the epitaxial layers. The pre-clean process may use a dilute hydrofluoric acid (dHF) solution or an SPM cleaning solution to clean byproducts such as native oxide within the recess 28. The SPM cleaning solution is a mixture of a sulfuric acid ($H_2SO_4$) solution, a hydrogen peroxide solution ($H_2O_2$), and deionized water. In addition, a pre-bake process can be performed after the pre-clean process to further remove the native oxide or remaining solution used in the pre-clean process. The pre-bake process can be performed by heating the silicon substrate 10 in a chamber containing hydrogen gas.

Figure 5:
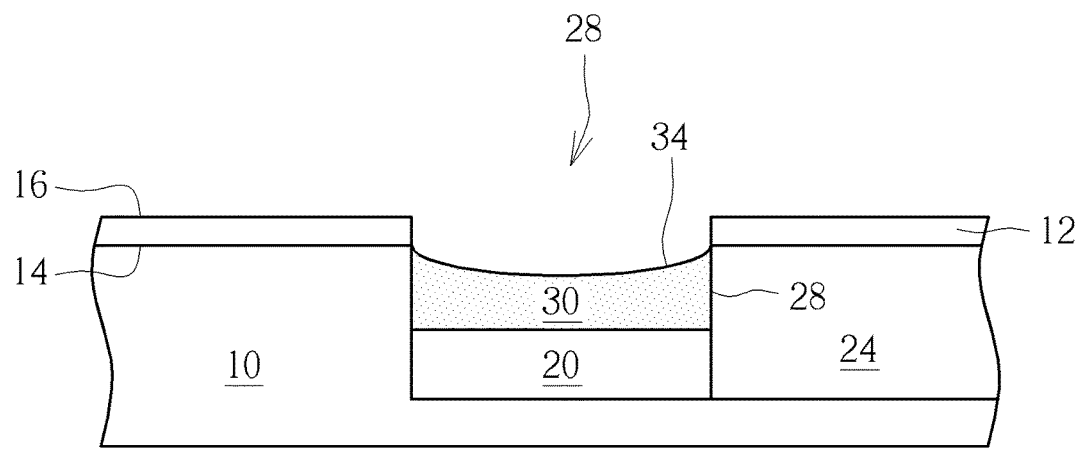
Figure 6:
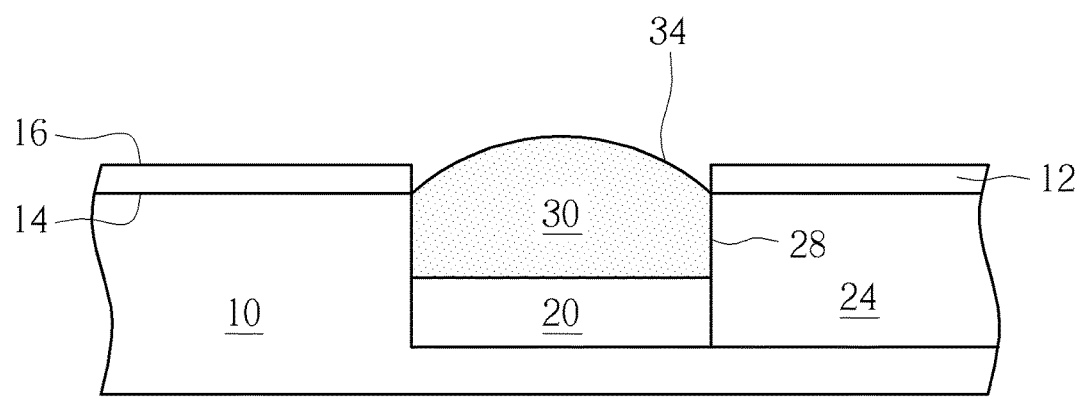
Figure 7:
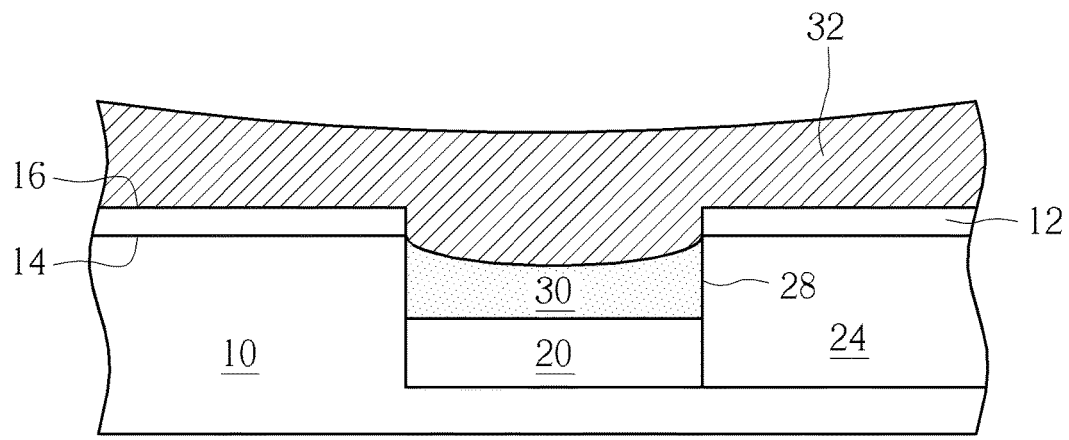

FIG. 5 to FIG. 7 shows critical steps of the present invention. The steps in FIG. 5 to FIG. 7 can be used in any process which requires epitaxial layers. It should be noted that the steps in FIG. 5 to FIG. 7 do not have to be combined with the steps shown in FIG. 1 to FIG. 4.

As shown in FIG. 5, a selective epitaxial growth process is performed to form a first epitaxial layer 30 in the recess 28. Later, a non-selective epitaxial growth process is performed to form a second epitaxial layer 32 in the recess 28 as shown in FIG. 7. The first epitaxial layer 30 may be silicon germanium, silicon phosphide or silicon carbide. The second epitaxial layer 32 may be silicon germanium, silicon phosphide or silicon carbide. The first epitaxial layer 30 and the second epitaxial layer 32 are preferably the same material. Advantageously, the first epitaxial layer 30 and the second epitaxial layer 32 are substantially identical materials.

As shown in FIG. 5, a selective epitaxial growth process is performed to form a first epitaxial layer 30 in the recess 28. It is noteworthy that the first epitaxial layer 30 does not cover the top surface 16 of the dielectric layer 12, and at least part of a top surface 34 of the first epitaxial layer 30 is lower than the top surface 16 of the dielectric layer 12. The profile of the top surface 34 of the first epitaxial layer 30 in FIG. 5 is concave. Under this condition, before any part of the top surface 34 of the first epitaxial layer 30 becomes higher than the top surface 16 of the dielectric layer 12, the selective epitaxial growth process should be stopped.

By adjusting the fabricating parameters, the profile of the top surface 34 can be controlled to become concave or convex. According to another preferred embodiment of the present invention, the profile of the top surface 34 of the first epitaxial layer 30 is convex as shown in FIG. 6. Under this condition, the top surface 34 of the first epitaxial layer 30 may be higher than the top surface 16 of the dielectric layer 12, but the first epitaxial layer 30 will not cover the top surface 16 of the dielectric layer 12.

The selective epitaxial growth process is a process in which the epitaxial growth of a semiconductor material occurs only on the exposed (non-covered) areas of the silicon material such as a silicon substrate rather than a non-silicon material such as a dielectric layer. The selective epitaxial growth process can be used for forming fin structures, source/drain regions, source/drain extensions, contact plugs or substrate for bipolar devices.

Tetrachlorosilane ($SiCl_4$) is generally used as silicon-based precursor gas in the selective epitaxial growth process. By adding hydrogen chloride in the reactant gas, the selectivity in epitaxial growth is improved. The deposition of the epitaxial layer can be adjusted by adjusting some parameters such as the surface condition of the silicon substrate, the size of the recess, the concentration of the hydrogen chloride, the type of the precursor gas, the growing pressure or the growing temperature.

The following embodiment illustrates the parameters according to a preferred embodiment of the preset invention. The parameters can be adjusted based on different product requirements. In the selective epitaxial growth process in FIG. 5, gases including dichlorosilane (DCS), germane ($GeH_4$) and hydrochloric acid (HCl) are introduced into the chamber, with the operating pressure between 10 to 50 torrs and the operating temperature between 500 to 800 degrees Celsius, to form the first epitaxial layer 30 in the recess 28. The first epitaxial layer 30 in this embodiment is silicon germanium. Dichlorosilane in this embodiment can be replaced by tetrachlorosilane. Dichlorosilane is introduced into the chamber at a flow rate of between 40 and 150 sccm. Germane is introduced into the chamber at a flow rate between 250 and 900 sccm. Hydrochloric acid is introduced into the chamber at a flow rate between 70 and 200 sccm. Dichlorosilane serves as a silicon-based precursor gas. Germane serves as a germanium-based precursor gas. The ratio of dichlorosilane to germane can influence the concentration of germanium in the first epitaxial layer. Preferably, the concentration of dichlorosilane is smaller than the concentration ratio of germane. Additionally, hydrochloric acid helps the first epitaxial layer 30 to grow selectively and make sure that the first epitaxial layer 30 only grows on the silicon substrate 10 and within the recess 28 rather than on the dielectric layer 12 formed by silicon oxide or silicon nitride. Preferably, a concentration of the hydrochloric acid is between that of the dichlorosilane and germanium.

FIG. 7 is a fabricating stage following FIG. 5. As shown in FIG. 7, a non-selective epitaxial growth process is performed to form a second epitaxial layer 32 in the recess 28. The second epitaxial layer 32 covers the first epitaxial layer 30 and the top surface 16 of the dielectric layer 12. As at least part of the first epitaxial layer 30 is lower than the top surface 16 of the dielectric layer 12, the recess 28 defined by the dielectric layer 12 and the silicon substrate 10 is not filled up by the first epitaxial layer 30. When the second epitaxial layer 32 is formed, the recess 28 will be filled up by the first epitaxial layer 30 and the second epitaxial layer 32.

The difference between the selective epitaxial growth process and the non-selective epitaxial growth process is that the epitaxial layer formed by the non-selective epitaxial growth process grows on all types of materials rather than only on silicon material. The second epitaxial layer 32 contacts both the silicon substrate 10 and the dielectric layer 12. Furthermore, a thickness of the second epitaxial layer 32 is greater than a thickness of the dielectric layer 12.

In the non-selective epitaxial growth process in FIG. 7, gases including dichlorosilane (DCS), germane ($GeH_4$) and hydrochloric acid (HCl) are introduced into the chamber, with an operating pressure between 20 to 100 torrs and an operating temperature between 500 to 800 degrees Celsius, to form the second epitaxial layer 32. The second epitaxial layer 32 in this embodiment is silicon germanium. Dichlorosilane in this embodiment can be replaced by tetrachlorosilane. Dichlorosilane is introduced into the chamber at a flow rate of between 50 and 200 sccm. Germane is introduced into the chamber at a flow rate between 200 and 700 sccm. Hydrochloric acid is introduced into the chamber at a flow rate between 10 and 50 sccm.

Figure 8:
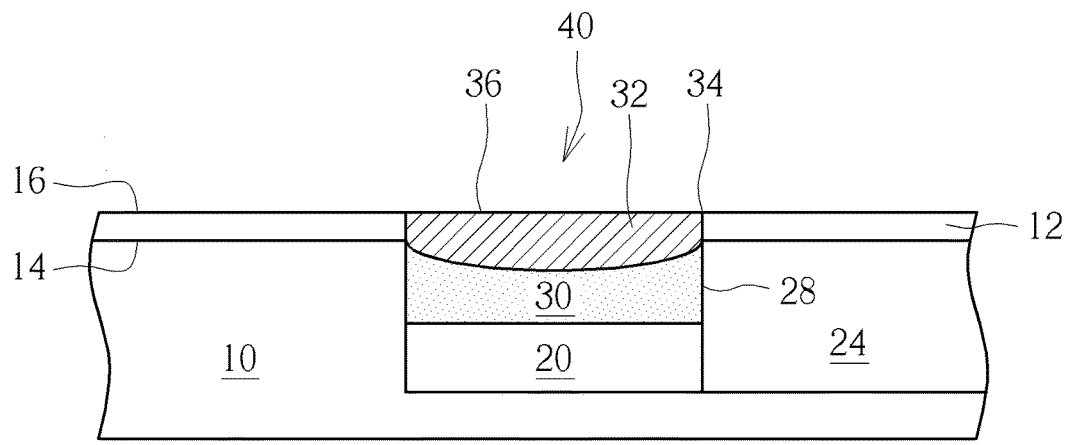

As shown in FIG. 8, the second epitaxial layer 32 is planarized to make the top surface 36 of the second epitaxial layer 32 align with the top surface 16 of the dielectric layer 12. In some cases, the first epitaxial layer 30 and the second epitaxial layer 32 are both planarized to make the top surface 34 of the first epitaxial layer 30, the top surface 36 of the second epitaxial layer 32 and the top surface 16 of the dielectric layer 12 aligned. At this point, the epitaxial layer 40 of the present invention is completed.

Figure 9:
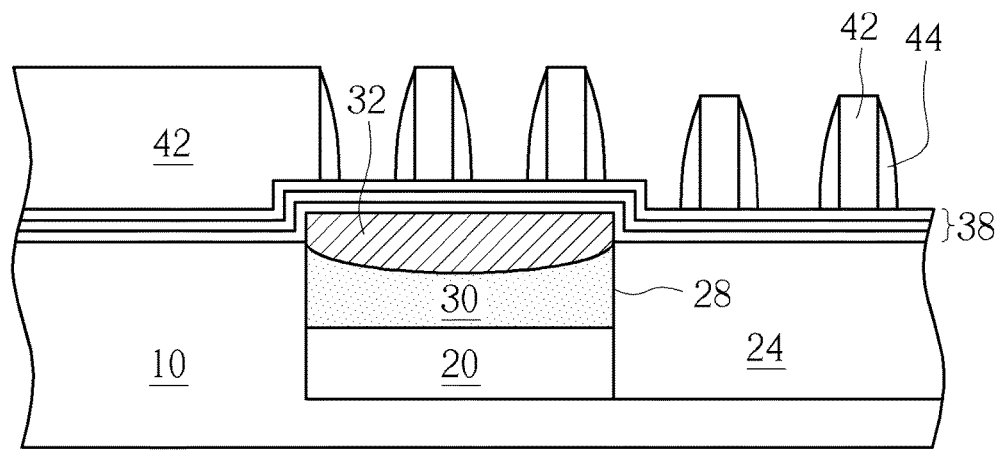

The epitaxial layer 40 may be formed in the P-type doping region 24 based on different product requirements. The first epitaxial layer 30 and the second epitaxial layer 32 of the present invention can be used in fin structures. For example, after the first epitaxial layer 30 and the second epitaxial layer 32 are completed, the silicon substrate 10, the first epitaxial layer 30 and the second epitaxial layer 32 are patterned to form numerous fin structures. As shown in FIG. 9, the dielectric layer 12 is removed completely. Then, a mask layer 38 is formed on the silicon substrate 10 and the second epitaxial layer 32. The mask layer 38 may be a silicon oxide/silicon nitride/silicon oxide ("ONO") structure or other dielectrics. A spacer self-aligned double-patterning (SADP) process is performed to pattern the mask layer 38. The steps of the SADP process include forming numerous mask layers 42 on the mask layer 38. Then, spacers 44 are formed at two sides of the mask layer 42 to make part of the mask layer 38 exposed from the mask layers 42 and the spacers 44. Next, the mask layers 42 are removed. Later, part of the mask layer 38 is removed by taking the spacers 44 as a mask. Subsequently, the spacers 44 are removed.

Figure 10:
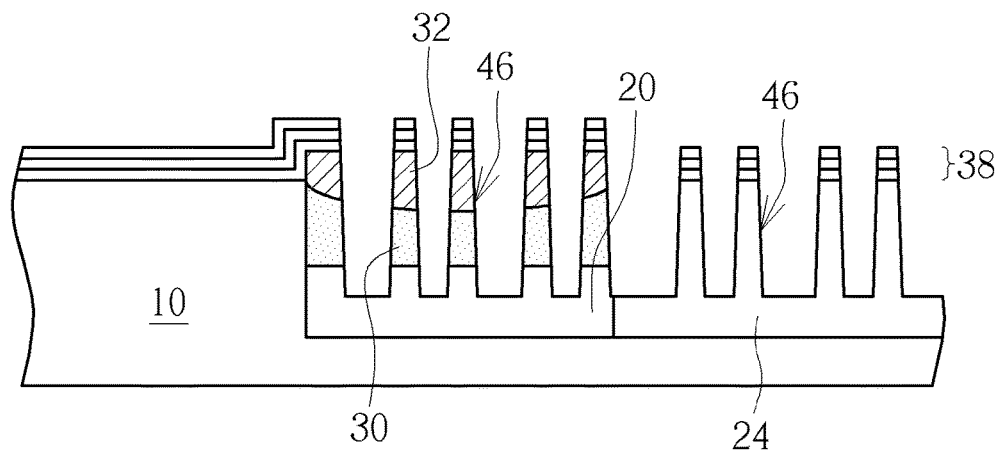

As shown in FIG. 10, the silicon substrate 10, the first epitaxial layer 30 and the second epitaxial layer 32 are etched by taking the mask layer 38 as a mask to form numerous fin structures 46. Some fin structures 46 consist of the silicon substrate 10 with an N-type doping region 20, the first epitaxial layer 30 and the second epitaxial layer 32. Other fin structures 46 consist of the silicon substrate 10 with a P-type doping region 24 and silicon substrate 10.

After forming the fin structures 46 shown in FIG. 10, the mask layer 38 can be removed. Then, shallow trench isolations can be formed between the fin structures. After that, a gate dielectric layer, a gate electrode, and source/drain regions can be formed on the fin structures 46 to compose FinFET devices.

The method of fabricating the epitaxial layer includes a selective epitaxial growth process and a non-selective epitaxial growth process. The selective epitaxial growth process is performed before the non-selective epitaxial growth process. In the present invention, a first epitaxial layer 30 formed by the selective epitaxial growth process fills part of the recess 28. Then, a second epitaxial layer 32 formed by the non-selective epitaxial growth process fills the rest of the recess 28. The top surface of second epitaxial layer 32 is almost without a step height. Therefore, after planarizing the second epitaxial layer 32, no dish will be formed on the top surface 16 of the dielectric layer 12 or on the top surface 14 of the silicon substrate 10. If only the selective epitaxial growth process is performed to form an epitaxial layer to fill the recess 28, the top surface of the epitaxial layer will be much higher than the top surface 16 of the dielectric layer 12, resulting in a large height difference between the top surface of the epitaxial layer and the top surface 16 of the dielectric layer 12. In this way, dishes will occur on the dielectric layer 12 and the silicon substrate 10 after planarizing the epitaxial layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an epitaxial layer, comprising:
providing a silicon substrate comprising a dielectric layer disposed thereon;
forming a recess in the silicon substrate and the dielectric layer;
performing a selective epitaxial growth process to form a first epitaxial layer in the recess, wherein the first epitaxial layer does not cover a top surface of the dielectric layer and the first epitaxial layer is free from contacting the dielectric layer;
performing a non-selective epitaxial growth process to form a second epitaxial layer in the recess, and the second epitaxial layer covering the top surface of the dielectric layer, wherein the recess is only filled up by the first epitaxial layer and the second epitaxial layer; and
planarizing the second epitaxial layer to align the second epitaxial layer with the top surface of the dielectric layer.

2. The method of fabricating an epitaxial layer of claim 1, wherein at least part of a top surface of the first epitaxial layer is lower than the top surface of the dielectric layer.

3. The method of fabricating an epitaxial layer of claim 1, further comprising forming a doping region in the silicon substrate before forming the recess.

4. The method of fabricating an epitaxial layer of claim 3, wherein the steps of forming the recess comprise removing part of the doping region.

5. The method of fabricating an epitaxial layer of claim 1, further comprising after planarizing the first epitaxial layer and the second epitaxial layer, patterning the first epitaxial layer, the second epitaxial layer and the silicon substrate to form at least one fin structure.

6. The method of fabricating an epitaxial layer of claim 1, wherein the first epitaxial layer comprises silicon germanium, silicon phosphide or silicon carbide.

7. The method of fabricating an epitaxial layer of claim 1, wherein the second epitaxial layer comprises silicon germanium, silicon phosphide or silicon carbide.

8. The method of fabricating an epitaxial layer of claim 1, wherein the dielectric layer comprises silicon nitride, silicon oxide or silicon oxynitride.

9. The method of fabricating an epitaxial layer of claim 1, wherein during the selective epitaxial growth process, the first epitaxial layer only grows on the silicon substrate, and the first epitaxial layer does not grow on the dielectric layer.

10. The method of fabricating an epitaxial layer of claim 1, wherein the dielectric layer contacts a top surface of the silicon substrate, and the top surface of the dielectric layer and the top surface of the silicon substrate are parallel.

* * * * *